United States Patent [19]
Ma et al.

[11] Patent Number: 5,912,595
[45] Date of Patent: Jun. 15, 1999

[54] DIGITALLY TEMPERATURE COMPENSATED VOLTAGE-CONTROLLED OSCILLATOR TUNABLE TO DIFFERENT FREQUENCY CHANNELS

[76] Inventors: John Y. Ma, 2/F 163 Tong Min Tseun, Tai Po; Sik-Hing Yuen, Unit 23, 16/F., Goldfield Ind. Centre, 1Sui Wo Rd., Fo Tan, Shatin, N.T., both of The Hong Kong Special Administrative Region of the People's Republic of China

[21] Appl. No.: 08/991,199

[22] Filed: Dec. 16, 1997

[51] Int. Cl.$^6$ ............................. H03B 5/04; H03L 1/02
[52] U.S. Cl. .................. 331/117 D; 331/158; 331/176; 331/177 V
[58] Field of Search .................. 331/44, 66, 116 R, 331/116 FE, 117 D, 158, 176, 177 R, 177 V

[56] References Cited

U.S. PATENT DOCUMENTS

| | | |
|---|---|---|
| 4,746,879 | 5/1988 | Ma et al. ........................ 331/116 FE |
| 5,081,431 | 1/1992 | Kubo et al. .......................... 331/176 |
| 5,389,899 | 2/1995 | Yahagi et al. ....................... 331/176 |
| 5,659,884 | 8/1997 | Daughtry, Jr. et al. ............. 331/176 |
| 5,757,244 | 5/1998 | Nonaka et al. ..................... 331/176 |
| 5,839,059 | 11/1998 | Hakkinen et al. ................. 331/176 |

*Primary Examiner*—Siegried H. Grimm
*Attorney, Agent, or Firm*—Arnold White & Durkee

[57] ABSTRACT

A digitally temperature compensated oscillator (TCO) system is provided which is capable of memorizing in an EEPROM-based look-up table, appropriate digital values of a temperature correction for a voltage controlled oscillator (VCO). An on-board temperature sensing mechanism tracks variations in temperature in the TCO and produces an analog voltage value corresponding to the instantaneous temperature. The voltage value of the sensor output is digitized and designated to constitute an address into the EEPROM based look-up table. As the temperature changes, the digitized output of the temperature sensor and hence the address to the EEPROM changes accordingly. The EEPROM also includes a look-up table of digitized channel tuning voltage values for tuning the VCO to at least one frequency for transmitting or receiving at least one channel, for example in the FRS group of channels. One of these digitized values is selected in response to operator selection of a channel. A temperature correction voltage value corresponding to the address represented by the measured temperature is extracted from the values stored within the EEPROM table and combined with the selected digitized channel tuning voltage and then converted into a corresponding analog voltage which is used to drive the voltage-controlled oscillator (VCO) in order to maintain the output frequency of the TCO stabilized at a desired value. The TCO includes an on-board microprocessor which allows integration of several of the TCO functions, including analog-to-digital and digital-to-analog, and the storage and retrieval of data to and from the EEPROM containing the look-up tables.

17 Claims, 3 Drawing Sheets

DIGITALLY TEMPERATURE COMPENSATED VOLTAGE-CONTROLLED OSCILLATOR TUNABLE TO DIFFERENT FREQUENCY CHANNELS

FIELD OF THE INVENTION

This invention generally relates to voltage-controlled oscillator circuits, such as those using piezoelectric crystals. More particularly, this invention relates to the digital control of a voltage-controlled oscillator in order to provide an oscillating frequency in response to operator selection of a corresponding channel, which oscillating frequency is stabilized against temperature variations and other factors affecting the frequency.

BACKGROUND OF THE INVENTION

In prior U.S. Pat. No. 4,746,879, a digitally temperature compensated-controlled oscillator (DTCCO) is disclosed. The present invention improves upon this DTCCO by adding the capability to tune the DTCCO to a selected frequency in response to operator selection of a corresponding channel, without adding additional hardware or parts to the DTCCO, other than a means for entering the channel selection. That is, the present invention incorporates the necessary information necessary for selecting a channel into the memory of a microprocessor which is preferably used for generating the necessary voltage for controlling the frequency generated by a voltage controlled oscillator, which memory also contains the necessary temperature compensation data. The applications of the present invention include the Family Radio Service (FRS) which is more fully described hereinbelow. The invention may also apply to the tuning of other channels with a digitally temperature compensated voltage-controlled oscillator, such as citizen's band radio, cellular phone, TVRO receivers, and others. Earlier U.S. Pat. No. 4,746,879 and its description are incorporated herein by reference.

The Family Radio Service (FRS) was established by the Federal Communications Commission (FCC) of the United States Government, effective Jul. 8, 1996. By this action, the FCC amended the Personal Radio Service rules to establish the FRS. Specifically, a number of channel frequencies were designated for the FRS as follows:

| Channel No. | (MHz) |
| --- | --- |
| 1 | 462.5625 |
| 2 | 462.5875 |
| 3 | 462.6125 |
| 4 | 462.6375 |
| 5 | 462.6625 |
| 6 | 462.6875 |
| 7 | 462.7125 |
| 8 | 467.5625 |
| 9 | 467.5875 |
| 10 | 467.6125 |
| 11 | 467.6375 |
| 12 | 467.6625 |
| 13 | 467.6875 |
| 14 | 467.7125 |

The use of piezoelectric crystals, such as quartz, as frequency standards constitutes an important application of piezoelectricity technically as well as commercially. A variety of piezoelectric crystal devices, such as crystal-based oscillator circuits, are commercially available and their use in the generation of precise frequency control and timing is extremely common and relies on the normally high quality factor of such piezoelectric crystals as mechanical resonators. Quartz crystals, for instance, serve as good frequency standards by virtue of their extremely high internal quality factor (i.e., the quality factor due to internal frictional losses, excluding mounting losses and air losses) which can attain a value of over 107 at a frequency of around 1 MHz. In addition, quartz exhibits high quality as a dielectric along with a low dielectric constant and is relatively easy to be cut and polished.

Piezoelectric crystals oscillators are capable of generating a wide range of precise frequencies at a given temperature, but for a given oscillator substantial variations in the frequency of operation occur as the temperature to which the crystal is subjected varies over a relatively large range. Although the frequency versus temperature characteristics of piezoelectric crystals are determined primarily by the angles of cut of the crystal plates with respect to the crystallographic axes of quartz, and the points of zero temperature coefficient can be varied over a wide range by varying the angles of cut, the frequency of oscillation for any given angle of cut remains substantially temperature dependent.

To achieve higher stability of oscillating frequencies, oven-controlled oscillators, in which the crystal unit and the temperature-sensitive components of the oscillator are placed in a stable oven whose temperature is set to the crystal's turnover temperature, are used. Such oven-controlled oscillators are bulky and consume added power. In addition, an oven-controlled oscillator requires about 10 minutes after being turned on in order to stabilize. Significant frequency shifts are also produced because of thermal stresses in the crystal during warm up and this thermal-transient effect can make the typical warm up time of a crystal oscillator longer than the time it takes for the oven to stabilize.

Problems associated with a drift in oscillator frequency as the temperature of operation fluctuates substantially are also prevalent in other kinds of voltage-controlled oscillators and limits their use in frequency sensitive applications.

Some of the above problems have been solved, at least in part, by temperature-compensated crystal oscillators (TCXO's) which use to advantage the fact that in crystal oscillators, the crystal unit is offered a load capacity by the oscillator circuit and the oscillator operates at the frequency where the crystal unit's reactance cancels the reactance of a load capacitor. The oscillator frequency is dependent upon the load capacitance of the oscillator circuit, and TCXO's function by compensating the frequency versus temperature behavior of the crystal by varying the load capacitance appropriately. Generally, the output signal from a temperature sensor in the form of a thermistor network is used to generate the correction voltage applied to a varactor in order to maintain frequency stability. Such TCXO's are capable of providing high frequency stability over a reasonable temperature range, are smaller and consume less power than oven-controlled oscillators, and require no lengthy warm up time. Conventional TCXO's generally use some sort of trimmed nonlinear analogue networks which generate control voltages for the crystal oscillator on the basis of input from a temperature sensor, and require complex measurement and trim algorithms in the presence of multiple non-linearities and scale factors. In addition, analog trimming has a limited range and entails the use of expensive and cumbersome hardware.

A further factor affecting the stability of the frequency of a crystal unit is the gradual change brought about as a result of crystal aging. Aging can result from a variety of causes such as mass transfer to or from the resonator's surfaces due to adsorption and desorption of contamination, and stress relief within the mounting structure or at the interface between the quartz crystal and the electrodes contacting the crystal. Although crystal aging observed at constant temperature usually follows an approximately logarithmic dependence on time and aging rate decreases as time elapses so that stabilization occurs within the unit each time the temperature of a crystal changes substantially, a new aging cycle starts and is accompanied by a corresponding frequency instability.

Crystals capable of increased frequency stability in the presence of temperature fluctuation and aging effects are available for frequency-sensitive operations but involve considerably increased cost due to the need for clean glass, metal or ceramic enclosures and advanced surface cleaning, packaging and ultra high vacuum fabrication techniques. The increased cost and accompanying bulk of such crystals constitutes a severe limitation to their use in most commercial applications requiring high frequency stability. Some currently available TCXO's do provide a relatively precise output frequency (variation of about ±5 ppm) over a limited temperature range, but these TCXO's use high-precision crystals which are costly because of the highly precise angle of cut and elaborate packaging.

The use of crystal oscillators as reference modules in cellular telephones in particular requires them to be extremely compact in order to keep the size of the phones as small as possible. In addition, this application requires a high degree of frequency stability in order to keep the operation of the cellular phones in conformance with strict FCC requirements. As a result, conventional crystal oscillator-based cellular phones have to be serviced at least once a year to adjust the oscillator unit to account for any frequency instability due to crystal aging.

Hence, there exists a need for a temperature-compensated oscillator which is capable of producing a stable output frequency over a wide range of temperature, and which can be turned to frequencies corresponding to the FRS channels, and which can be fabricated in the form of an economical and compact unit.

SUMMARY OF THE INVENTION

Accordingly, it is a primary object of this invention to provide an improved temperature-compensated oscillator (TCO) which can be tuned to frequencies corresponding to selected channels, has increased frequency stability and yet does not require a high quality, high cost crystal unit.

A related object of this invention is to provide a TCO which can be tuned to frequencies corresponding to the channels of the family radio service (FRS).

Another related object of this invention is to provide such a TCO which does not have to be calibrated on site.

A further object of this invention is to provide a TCO of the above kind which operates under low power and low current drain conditions.

Another object of this invention is to provide the above TCO with increased frequency stability over an increased range of temperatures.

Yet another object of this invention is to provide a TCO system which provides convenient calibration as well as extensive self-test capabilities and which eliminates the need for mechanical trimming in order to maintain a stabilized oscillator frequency.

These and other objects of this invention are realized by providing a digital TCO system which is capable of ascertaining and memorizing, e.g., by storing them in an EEPROM-based look-up table, appropriate digital values of voltages for tuning a voltage controlled oscillator (VCO) to frequencies corresponding to one or more channels which may be selected, and also digital values of a temperature-compensating tuning voltage during calibration. An on-board temperature sensing mechanism tracks variations in temperature in the VCO and produces an analog voltage value corresponding to the instantaneous temperature. The voltage value of the sensor output is digitized and designated to constitute an address into the EEPROM based look-up table. Channel selection information is generated and used by the EEPROM to select a digital channel voltage value corresponding to the frequency required for either transmitting or receiving the selected channel.

As the temperature changes, the digitized output of the temperature sensor and hence the address to the EEPROM changes accordingly. The VCO temperature-compensating tuning voltage value corresponding to the address representing the measured temperature is extracted from the values stored within the EEPROM table, combined with the selected channel tuning voltage value and then converted into a corresponding analog voltage which is used to drive a voltage controlled oscillator (VCO) in order to maintain the output frequency of the TCO stabilized at a frequency for either receiving or transmitting the selected channel.

The TCO includes an on-board microprocessor which allows integration of most of the TCO functions, including the analog-to-digital and digital-to-analog conversion, as well as the storage and retrieval of data to and from the EEPROM containing the look-up tables. The microprocessor of the TCO controls access to the EEPROM table for generating the proper tuning voltage to be fed to the TCO on the basis of input from the on-board temperature sensor.

The system of this invention is efficient because each point on the temperature versus frequency curve can be independently trimmed and verified. In addition, the trim algorithm is simple and non-interactive, and the trimming itself is inexpensive as it involves just the programming of the EEPROM on the basis of test values generated as part of a calibration process.

BRIEF DESCRIPTION OF THE DRAWINGS

The invention and other objects and advantages thereof, may best be understood by referring to the following description along with the accompanying drawings in which.

DESCRIPTION OF ILLUSTRATIVE EMBODIMENTS

While the invention will be described in connection with certain preferred embodiments, it will be understood that it is not intended to limit the invention to those particular embodiments. On the contrary, it is intended to cover all alternatives, modifications and equivalent arrangements as may be included within the scope of the invention as defined by the appended claims.

In particular, it will be noted that while the system of this invention has been described with reference to digital frequency compensation and control of a crystal-based voltage-controlled oscillator, it can be used effectively with most types of oscillators wherein a tuning voltage controls the frequency of oscillations.

Figure 1:
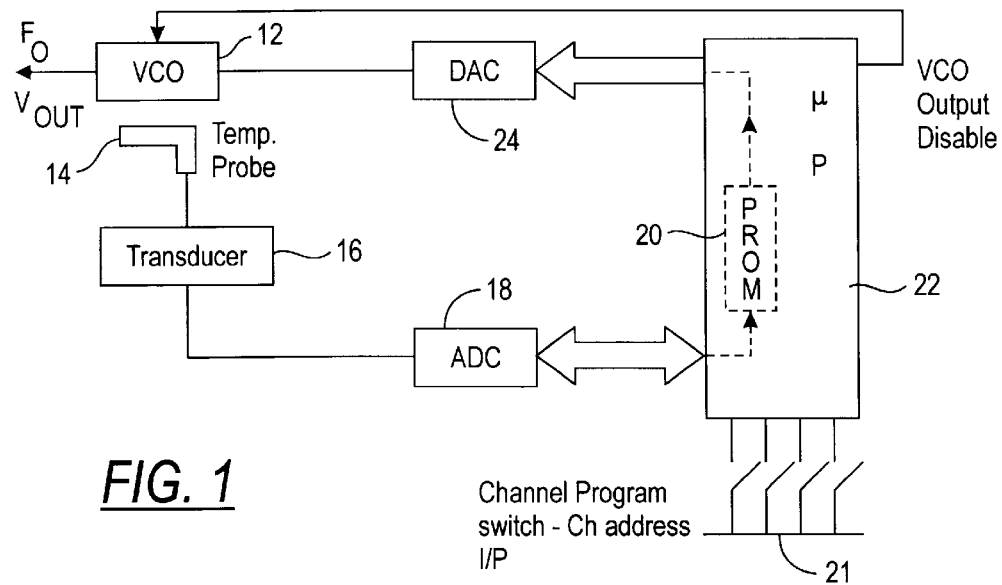
FIG. 1 is a block diagram illustrating the basic functioning of a family radio service temperature-compensated voltage-controlled oscillator system according to this invention.

Referring now to the drawings and specifically to FIG. 1, there is shown an exemplary TCO system embodying the present invention. The TCO system 10 essentially comprises a voltage-controlled oscillator (VCO) 12 which generates an output frequency Fo. A temperature sensing probe 14 tracks the instantaneous ambient temperature within the VCO and in conjunction with a transducer 16 produces a corresponding analog electrical output. The analog signal generated by the temperature transducer 16 is converted to a digital signal by an analog-to-digital converter (ADC) 18 which in turn is in communication with a programmable read only memory (PROM), and preferably, an electrically erasable and programmable read only memory (EEPROM) 20. The EEPROM is preferably based within a conventional CMOS microprocessor 22.

According to one feature of this invention, the EEPROM 20 has stored within it a series of digital values of a frequency (or channel) tuning voltage for the VCO 12 in the form of a look-up table. Each digital value stored in the look-up table corresponds to a voltage for causing the VCO to tune to a frequency for either receiving or transmitting a given channel. For purposes of description, operation of the invention will be described herein with reference to receiving or transmitting one of the 14 channels of the family radio service, at the frequencies and channel numbers as noted hereinabove. However, it will be understood that the invention may be used to transmit and/or receive other channels as well, such as citizen's band, cellular phone, TVRO and others. It will be appreciated that in the case of a receiver, this frequency will be higher or lower than the frequency shown in the above table by an amount corresponding to the intermediate frequency IF used in the receiver. Often, an IF frequency of 10.7 MHz is used. Thus, for example, to receive FRS channel 1 (462.5625 MHz), the VCO will generate a frequency of 462.5625 MHz±10.7 MHz= 473.2625 Mhz or 451.8625 Mhz. The EEPROM will provide digital values corresponding to appropriate voltages, for causing the VCO to tune to not only the frequencies in the above list of FRS frequencies, but also to a set of frequencies which are 10.7 MHz (or whatever other value is used for the IF) higher than these frequencies.

In order to sort the appropriate digital value stored in the look-up table of the EEPROM 20, a channel address input means or array 21 is provided for producing channel information to the EEPROM corresponding to each of the FRS channels. In FIG. 1, the array 21 has been illustrated as a plurality of switches which can be used to form a digital representation of each of the 14 channels of the FRS in response to operator selection of a channel at appropriate operator-accessible selector means (not shown). All 14 of these channels can be accommodated this way. It is also within the scope of the invention to provide a single, hard wired channel selected from the 14 FRS channels, with the EEPROM memorizing or storing a single digital tuning voltage value for tuning the VCO 12 to the frequency corresponding to the single channel. Upon receiving the appropriate channel selection information, in the case of multiple channels, from the channel selector address input 21, the EEPROM uses the digital information as an address for indexing to the look-up table to retrieve the corresponding frequency tuning voltage stored therein.

According to another feature of this invention, the EEPROM 20 has stored within it a series of digital values of the temperature-compensating tuning voltage for the VCO 12 in the form of a look-up table. Each digital value stored in the look-up table corresponds to a specific temperature value within the overall range of temperature fluctuation which the VCO 12 is expected to encounter in its area of application. For any given temperature value within the specified temperature range of operation of the crystal oscillator, the corresponding digital value stored in the look-up table represents the temperature-compensating tuning voltage required to be fed to the VCO in order to neutralize any frequency drift at its output at that temperature and hence maintain the output frequency at a desired constant level.

Figure 3:
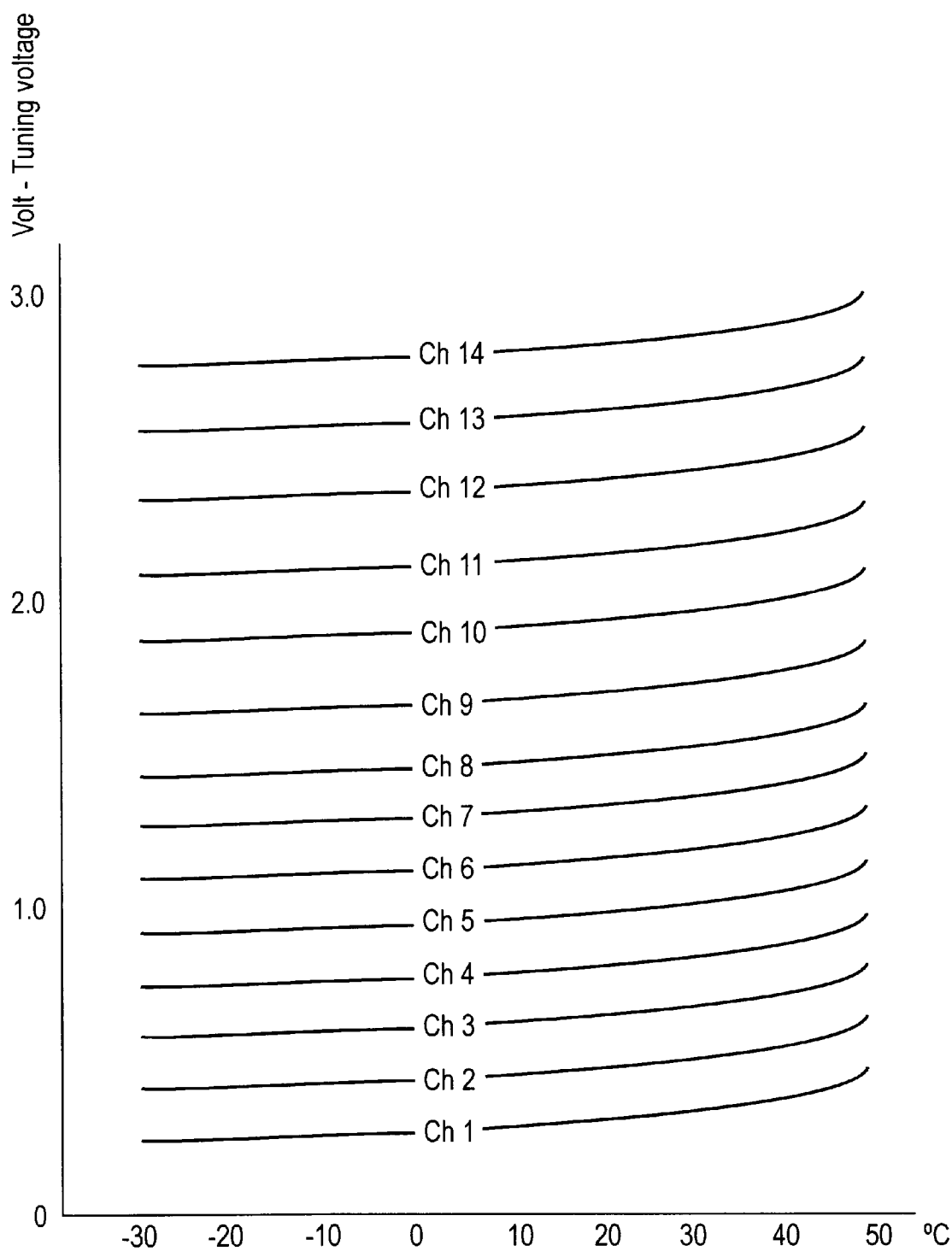
FIG. 3 is a graph showing a hypothetical example of tuning voltage vs. temperature.

FIG. 3 shows a graph of a hypothetical set of curves of VCO tuning voltage vs. temperature for the 14 FRS channels. Other voltage/temperature curves might be developed for various VCO's without departing from the invention. FIG. 3 is a hypothetical example to further illustrate the operation of the invention in accordance with what is shown and described herein with reference to the other drawings.

The system of this invention functions by using the digitized output of the ADC 18 as an address or index into the look-up table in order to retrieve the corresponding temperature-compensating tuning voltage value stored therein. Subsequently, the retrieved frequency tuning voltage value and temperature-compensating voltage values are combined and fed to a digital-to-analog converter (DAC) 24 for translating the combined digital value into a corresponding analog signal which is then fed to the VCO 12 to maintain its output frequency at the desired set point. The ADC, the DAC and, if possible, the temperature sensor are preferably based with the microprocessor of the TCO system.

The provision of the microprocessor 22 as part of the TCO system makes the TCO versatile by providing it with a variety of capabilities such as self-testing and self-calibration which will be described in detail below. A major advantage of this system is that the generation of the temperature-compensating tuning voltage for the VCO can be performed on an almost instantaneous basis since the output frequency of the oscillator need not be monitored as the temperature changes. Instead, each time the temperature of the VCO changes, the corresponding tuning voltage value required to keep the output frequency at the desired constant value is readily available within the look-up table and can be extracted therefrom and fed to the VCO in order to stabilize the output frequency.

Figure 2:
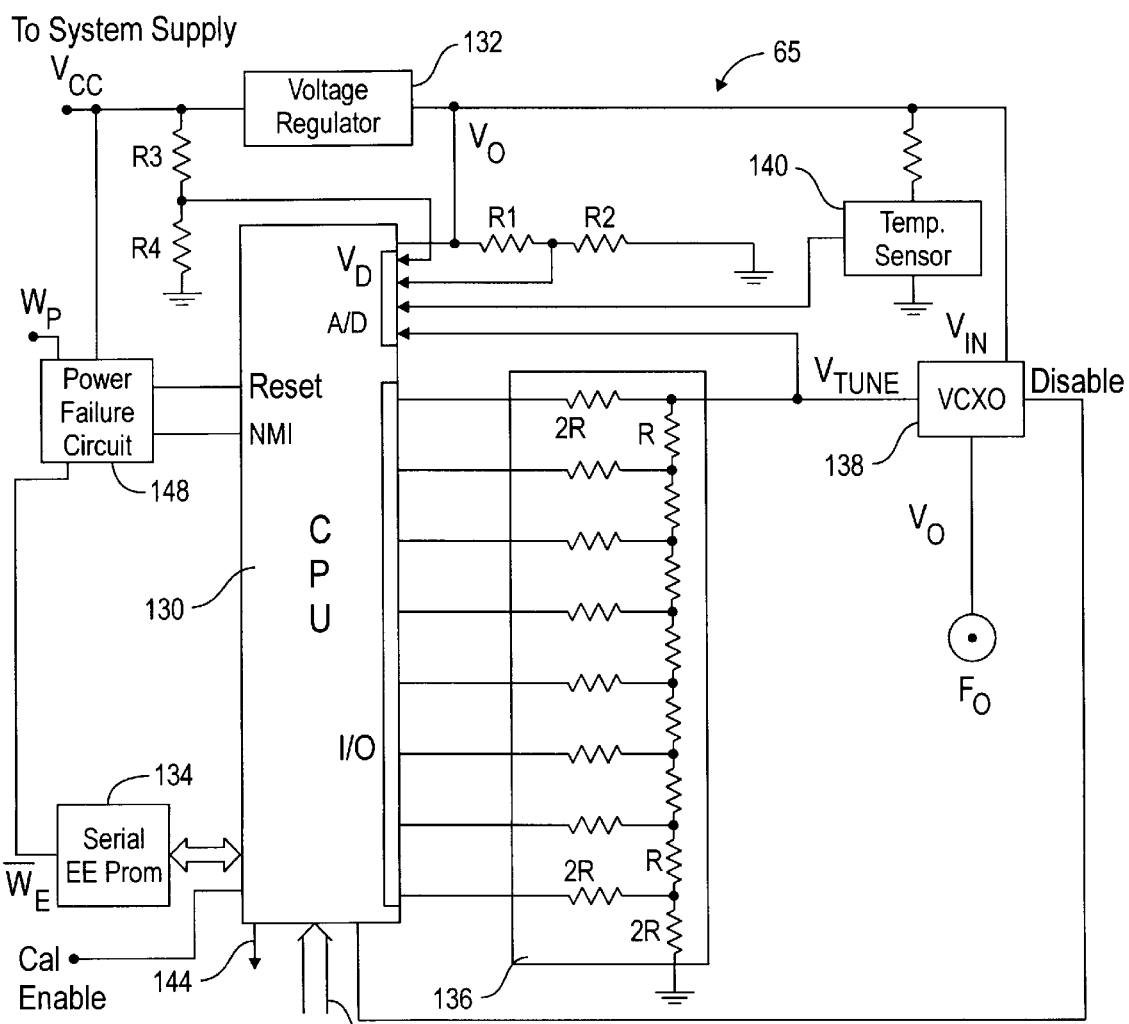
FIG. 2 is a more detailed schematic diagram of an exemplary temperature-compensated oscillator according to this invention illustrating its main components.

Referring now to FIG. 2, there is shown a more detailed schematic diagram of the preferred embodiment of a TCO according to this invention. As shown, the TCO essentially comprises a central processing unit (CPU) 130 which is powered by a voltage regulator 132 connected to the main system supply of FIG. 2. The output voltage VO from the voltage regulator 132 is provided to the supply point VD of the CPU 130 and also to one of a series of analog-to-digital conversion points which form part of the ADC built into the central processing unit. This supply voltage VO is applied through a voltage divider comprising resistors R1 and R2 and constitutes a ratiometric input to the ADC which provides a voltage reading which effectively is a percentage value relative to the voltage at the supply point VD of this CPU. The system supply voltage Vcc is also applied to one of the analog-to-digital conversion input points through a voltage divider comprising resistors R3 and R4, and constitutes a ratiometric input to the ADC which provides a voltage reading which effectively is a percentage value relative to the voltage at the supply point Vcc for the voltage regulator V32. During normal operation, as well as during the actual calibration process, the voltage provided by the system supply is regulated and hence the ADC input provided by R3 and R4 can be used as a reference to compare and test the output voltage VO of the voltage regulator 132 as part of the self-testing of the TCO.

In the illustrative embodiment of FIG. 2, the TCO 65 is provided with an EEPROM 134 which is located externally to the CPU 130 and placed in communication with the CPU through its input/output channel lines. The DAC for the TCO is in the form of the R-2R network 136 which is also connected to the CPU through its input/output channel lines. The output of the R-2R network 136 is fed to the main voltage-controlled crystal oscillator (VCO) 138 for the TCO 65 and serves as the controlling voltage for adjusting the output frequency of the VCO 138. The VCO is supplied with electrical power by the regulated output of the voltage regulator 132, as well as by the system supply voltage Vcc.

The R-2R network 136 of the TCO does not require the amplification stage conventionally associated with it because the tuning voltage input of the VCO 138 has a high impedance inherent to the oscillator circuit itself as will be described in detail below. Because the resulting current drain is low, the output of the R-2R network can directly serve as the frequency-compensating tuning voltage to the VCO. The R-2R network is provided with a pull-up resistor in order to attenuate or limit the range of output voltage of the digital-to-analog converter 136 to the linear portion of the TCO tuning range. The effective resolution of the DAC is virtually doubled by further splitting the maximum output voltage range of the R-2R network, as will be described in detail below.

The temperature monitoring capability of the TCO 65 is provided by a temperature sensor 140 which is also powered by the voltage regulator 132 and produces an analog output voltage corresponding to the temperature being sensed at a given instant. The analog output of the temperature sensor 140 is fed, after passing it through suitable scaling and offset amplifiers (not shown), to one of the inputs of the analog-to-digital converter provided on-board the CPU 130 for the TCO in order to digitize it for further processing.

The basic sequence of operations that the TCO 65 undergoes begins with the temperature sensor 140 identifying the ambient temperature of the VCO 138 and transducing it into an electrical voltage which is scaled and offset to match the input voltage range of the ADC on board the CPU 130, as will be described in detail below. The resulting voltage is then converted into its corresponding digital value by the ADC. It will be noted that the EEPROM 134 at this stage has stored within it the look-up table of temperature-compensating voltage values corresponding to discrete temperature values spanning the expected temperature fluctuation range for the TCO, as part of the calibration and testing process. The CPU 130, during actual on-site usage, uses the digitized output of the temperature sensor as an address or index into the look-up table stored within the EEPROM 134 and extracts the corresponding value of the temperature-compensating voltage required to maintain the output frequency of the VCO 138 at a desired set point. Subsequently, the extracted voltage value, which is in a digital format, is fed to the DAC represented by the R-2R network 136 which, in conjunction with the DAC range selection arrangement, converts it into a corresponding analog signal which can be used to control the output frequency of the VCO.

The central processing unit 130 includes a port 142 that allows the TCO to communicate with the channel address input 21 as indicated above with respect to FIG. 1. That is, the port 142 may be used to connect to the channel program switches or other channel address input 21 for delivering the channel selection information to the CPU 130 for use by the PROM 134 in selecting appropriate frequency tuning information for the channel selected from the FRS channels. In FIG. 2, the analog output voltage generated by the DAC 136 is also fed back to one of the inputs of the ADC on board the CPU 130. This connection and the connections of the voltage regulator output VO and the system supply voltage Vcc to the on-board ADC, serve as self-test channels for the TCO since the CPU can use them to perform further comparisons to ensure their accuracy and stability; this feature constitutes one of the many advantages of providing a central processing unit on board the TCO system.

The CPU 130 is also provided with a self-test line 144 which is adapted to flag the success or failure of a pre-programmed self-test procedure each time the TCO system is initially powered. The self-test procedure generally includes tests to determine whether or not the CPU, the EEPROM, the on-board ADC as well as the R-2R network constituting the DAC are functioning properly. The test sequence can also include a preliminary check of the EEPROM to ensure that all designated values within the EEPROM-based look-up table have been properly stored within the EEPROM as part of the calibration procedure. For instance, the EEPROM can be tested on the basis of a checksum test involving the addition of all data stored within the look-up table and comparing it to a pre-designated checksum. The test sequencing can further include tests, via the on-board ADC, of the voltage regulator output as compared to the normally regulated system supply voltage Vcc. In addition, the CPU function itself can be tested; by implication if the CPU is capable of actually performing the test and by specific tests designed to test CPU function. The provision of this self-test pin provides the TCO system with a basic self-test capability even if the complexity of the serial port is dispensed with, since it permits simplified self-testing by checking the output status of just one pin without having to go through a complicated serial protocol.

The TCO is provided with a "power failure" circuit 148 which detects any drop in input voltage below a predefined minimum value and accordingly regulates a series of control lines linking it to the CPU 130 and the EEPROM 134 of the TCO. The power failure circuit gates a write protect input Wp which enables or disables writing of data into the EEPROM 134 through a write enable line We during initial calibration or subsequently during aging offset correction. The Wp input is gated by the power fail circuit in such a way as to disable the writing of data into the EEPROM under low voltage conditions. The status of Wp is controlled by the calibration and test system or the host radio.

The power failure circuit 148 also gates a reset line to the microprocessor of the TCO which is held active after power-on or after a return to normal voltage following occurrence of low voltage conditions, for a period of time sufficiently long to ensure proper reset of the microprocessor. The circuit 148 controls a non-maskable interrupt (NMI) input which is pulled active whenever a power failure is detected in order to interrupt the microprocessor so that appropriate measures, such as disabling the VCO output, setting the self-test pin to the "fail" state, may be taken.

The CPU 130 of the TCO also has a separate calibration enable (CAL ENABLE) input line for use during the initial calibration sequence. When the CAL ENABLE line is pulled active, while the write protect input Wp is also active, the microprocessor begins storing data representing the optimum compensating tuning voltage value into the EEPROM. Providing the CAL ENABLE function on a separate line instead of as a serial port command provides certain advantages: (i) it prevents a false command on the serial port from destroying the EEPROM data table, and (ii) modification of the EEPROM data table can be easily prevented by hard-wiring the CAL ENABLE to be inactive. The CPU 130 of the TCO has a DISABLE line connected to the VCO which allows the CPU to shut off the VCO output during power failure conditions or during the TCO stabilization time following power-up. The DISABLE may also be activated through the CPU by an externally generated command if the VCO output frequency is found to be out of specified limits.

If the EEPROM within the TCO has excessive current drain, a transistor switch (not shown) can be connected to the EEPROM and controlled by the TCO microprocessor to gate the power or control line to the EEPROM in such a manner as to keep the EEPROM turned on only when it is being used.

In addition to providing the various self-testing and system control functions, the provision of the central processing unit on board the TCO system brings about a significant reduction in components used as part of the TCO system. More specifically, the central processing unit makes possible the use of a serial EEPROM instead of a conventionally used parallel bipolar EEPROM or PROM, thereby bringing about a reduction from a 20-pin parallel EEPROM or PROM IC package to an 8-pin serial EEPROM IC. The CPU also dispenses with the need for discrete digital-to-analog converters and analog-to-digital converters which are typically 18 or 20-pin IC's, since the on-board microprocessor provides most of these functions within a conventional single package IC. In effect, although the illustrative embodiment employs a microprocessor in addition to the rest of the TCO circuitry the overall system is in fact simplified and made more compact and economical by having all possible capabilities built into the processing system. This ultimately results in a greatly optimized form factor for devices in which the crystal oscillator system is used.

In addition, the use of a microprocessor permits the use of an EEPROM having significantly reduced storage capacity since there may be no need to measure and record all required values of the temperature-compensating voltage corresponding to all designated temperature values as part of the calibration procedure. Instead, readings may be taken only at preselected temperature values and the values of the temperature-compensating voltage corresponding to the remaining temperature values can be obtained by using the central processing unit of the microprocessor to interpolate between the read values. The microprocessor also brings about further reduction in storage requirements by allowing the use of data compression and expansion techniques.

The use of a serial EEPROM, made possible by use of the on-board microprocessor, provides another advantage in that it results in a significantly lower current drain on the TCO circuit as compared to a parallel bipolar PROM. In addition, it makes possible the remote monitoring of an output frequency derived from the TCO, through a base station tracking the output of the host radio containing the TCO, identification of any frequency drift with respect to a pre-defined set point, and the subsequent transmission to the CPU of instructions indicating that an appropriate offset value be stored in the EEPROM and be added to the values extracted from the EEPROM look-up table in order to retain stability over the output frequency of the oscillator. This type of offset adjustment or trimming is of particular use in preventing the problems generally arising out of frequency drifts due to normal aging of the crystal unit used within the TCO. The microprocessor also serves as a simple and convenient means for disabling the output of the VCO whenever constant remote monitoring of the output frequency reveals a frequency drift beyond a pre-defined allowable range without resorting to additional tracking and delay circuitry. This disabling feature is of particular use in preventing problems arising due to the stabilization time of the TCO each time the TCO system is powered on and goes through a warm-up cycle. The VCO can be disabled for a length of time sufficient to allow stabilization (e.g., for 10 seconds) following power-up of the TCO.

Figure 4:
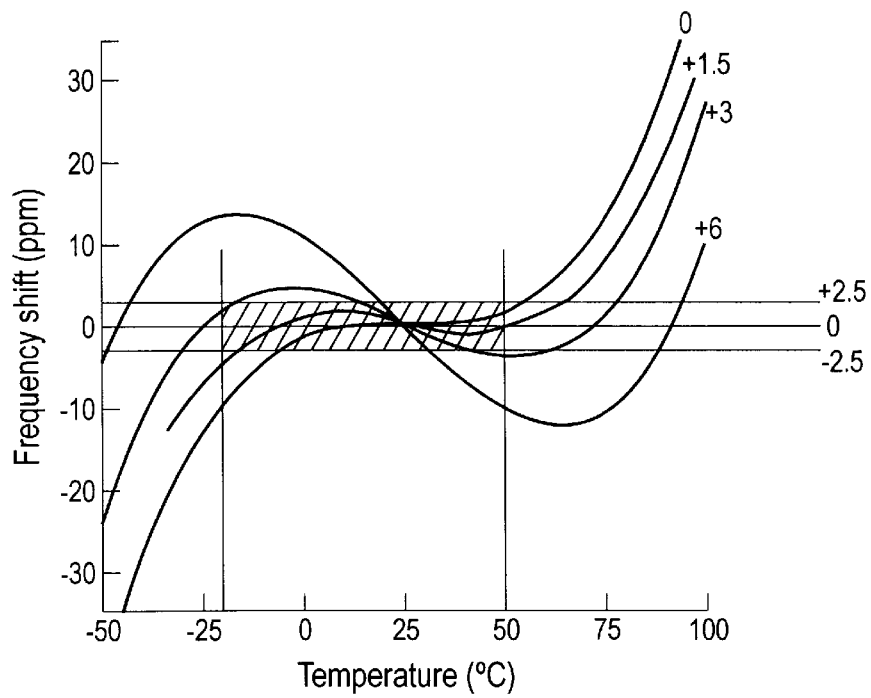
FIG. 4 is a graph of temperature-frequency characteristics of high-frequency (AT-cut) crystals.

FIG. 4 illustrates some typical temperature-frequency characteristics of high-frequency (AT-cut) crystals. Generally speaking, the smaller the frequency shift over a range of temperatures in parts per million (ppm) the more expensive the crystal. For example, a crystal capable of only ±2.5 ppm frequency shift in the range from −20° C. to +50° C. is relatively expensive (e.g. U.S. dollars $2.50). On the other hand, a less expensive crystal might typically show a shift of ±20 ppm over the same temperature range, but would cost only a fraction of the cost of the more expensive crystal (e.g. U.S. $0.30)

Figure 5:
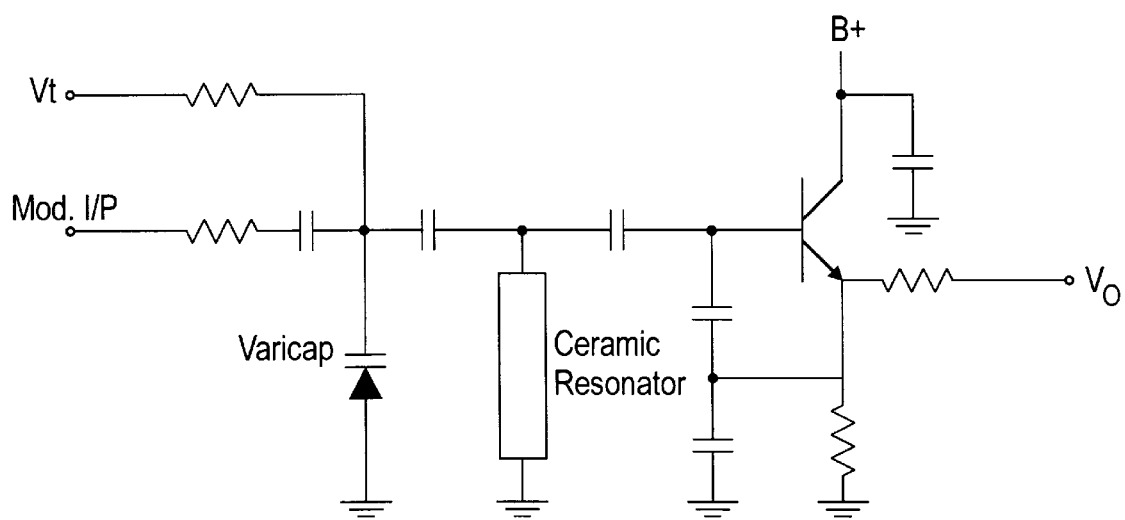
FIG. 5 is a schematic of a ceramic resonator VCO circuit.

FIG. 5 shows a relatively low cost voltage-controlled oscillator circuit (VCO) using a ceramic resonator. The VCO of FIG. 5 may advantageously be utilized with the present invention, in view of the temperature compensation provided by the invention.

What is claimed is:

1. A temperature compensated oscillator (TCO) capable of accurately generating a frequency for performing at least one of transmitting and receiving at least one channel and which is stabilized over a selected temperature range, said TCO comprising:

a voltage controlled oscillator (VCO) with a frequency of operation controllable by an analog tuning voltage Vc;

transducer means for sensing the ambient temperature of the VCO and generating a corresponding analog electrical signal;

ADC means for converting said analog signal to a corresponding digital temperature value;

channel address means for producing channel information corresponding to at least one channel;

storage means for storing at least one channel digital voltage values corresponding to a frequency for performing at least one of transmitting and receiving said at least one channel, and a plurality of temperature digital voltage values corresponding to said digital temperature values for discrete temperature points extending across said selected temperature range;

processor means for using said channel information and said digital temperature values as indices to extract and combine the corresponding channel and temperature digital voltage values from said storage means so as to produce corresponding digital Vc values; and DAC means coupled with said processor means and with said VCO for converting a digital Vc value into a corresponding analog tuning voltage Vc and for feeding the analog Vc signal to said VCO in order to maintain said stabilized frequency of operation.

2. The TCO of claim 1 wherein said channel address means includes means for producing channel information corresponding to each of plurality of channels and wherein said storage means stores a plurality of channel digital voltage values corresponding to frequencies for at least one of transmitting and receiving each of said plurality of channels.

3. The TCO of claim 2, wherein said plurality of channels comprise the channels of the family radio service (FRS).

4. The TCO of claim 1 wherein said processor means for using the digital temperature values to extract the digital Vc values comprises a microprocessor.

5. The TCO of claim 1 wherein said storage means is a programmable read-only-memory (PROM).

6. The TCO of claim 4 wherein said storage means is a programmable read-only-memory (PROM).

7. The TCO of claim 6 wherein said PROM is a part of the microprocessor.

8. The TCO of claim 1 wherein said VCO is a crystal-based voltage-controlled oscillator.

9. The TCO of claim 4 wherein said ADC and said DAC means are part of the microprocessor.

10. The TCO of claim 1 wherein each of said digital Vc values represents the tuning voltage required to be fed to the VCO at the corresponding sensed temperature in order to maintain its frequency of operation stabilized at the frequency of at least one channel.

11. The TCO of claim 5 wherein said PROM is an electrically-erasable PROM (EEPROM).

12. The TCO of claim 2 and further including operator selection means for individually selecting each of said plurality of channels.

13. The TCO of claim 3 and further including operator selection means for individually selecting each of said plurality of channels.

14. The TCO of claim 1 wherein said VCO comprises a ceramic resonator VCO.

15. A method for maintaining the output frequency of a voltage controlled oscillator (VCO) stabilized at a frequency for either transmitting or receiving an operator selected channel over a selected temperature range, including the steps of:

digitizing and storing a plurality of tuning voltage Vt values corresponding to frequencies for either transmitting or receiving channels in a manner allowing them to be subsequently retrieved using corresponding channel information;

determining at each of a series of discrete temperature levels represented by corresponding digital temperature values and spread over said temperature range, a temperature correction value VTC for the tuning voltage Vt required to maintain the output frequency of said VCO at said frequency for transmitting or receiving an operator selected channel;

digitizing and storing said determined VTC values in a manner allowing them to be subsequently retrieved by using the corresponding digital temperature values as indices, sensing and digitizing the ambient temperature of the VCO during its operation;

producing channel information corresponding to an operator selected channel;

using the channel information to retrieve the corresponding stored digital Vt value;

using the sensed digital temperature value as an index to retrieve the corresponding stored digital VTC value;

combining the retrieved Vt and VTC values to produce a digital Vc value;

converting the digital Vc value to its corresponding analog tuning voltage form; and feeding the analog tuning voltage to the VCO in order to maintain its output frequency at the desired value.

16. The method of claim 15 wherein the tuning voltage values Vt and the temperature correction values VTC are stored in a programmable-read-only-memory (PROM) and the storage and retrieval is performed through a processor.

17. The method of claim 15 wherein the tuning voltage values VT and the temperature correction values VTC are stored in an electrically-erasable-programmable read-only-memory (EEPROM).

* * * * *